US011276592B2

(12) United States Patent
Hirose et al.

(10) Patent No.: US 11,276,592 B2
(45) Date of Patent: Mar. 15, 2022

(54) PROCESSING APPARATUS AND PROCESSING METHOD

(71) Applicant: Tokyo Electron Limited, Tokyo (JP)

(72) Inventors: Katsuhito Hirose, Nirasaki (JP); Koichi Miyashita, Nirasaki (JP); Hiroshi Hirose, Nirasaki (JP); Satoshi Gomi, Nirasaki (JP); Yasunori Kumagai, Nirasaki (JP); Takashi Yoshiyama, Hachiouji (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 36 days.

(21) Appl. No.: 16/838,292

(22) Filed: Apr. 2, 2020

(65) Prior Publication Data

US 2020/0328100 A1  Oct. 15, 2020

(30) Foreign Application Priority Data

Apr. 11, 2019  (JP) .............................. JP2019-075709

(51) Int. Cl.
*H01L 21/67* (2006.01)
*G05B 19/418* (2006.01)
*H01L 21/02* (2006.01)

(52) U.S. Cl.
CPC .. *H01L 21/67253* (2013.01); *G05B 19/41865* (2013.01); *H01L 21/0228* (2013.01); *H01L 21/67276* (2013.01)

(58) Field of Classification Search
CPC ........ C23C 16/45544; C23C 16/45561; G05B 19/41865; H01L 21/0228; H01L 21/67253; H01L 21/67276
See application file for complete search history.

(56) References Cited

U.S. PATENT DOCUMENTS

| 2004/0143370 | A1* | 7/2004 | Lu | ........................ | G05D 11/133 |
| | | | | | 700/282 |
| 2010/0190348 | A1* | 7/2010 | Akae | .................... | H01L 21/0217 |
| | | | | | 438/703 |
| 2015/0004721 | A1* | 1/2015 | Akimoto | ........... | H01L 21/31138 |
| | | | | | 438/9 |
| 2016/0122871 | A1* | 5/2016 | Lee | .................... | H01L 29/40117 |
| | | | | | 156/345.24 |

FOREIGN PATENT DOCUMENTS

| CN | 108884566 A | 11/2018 |
| JP | 2002329674 A | 11/2002 |
| KR | 1020110139322 A | 12/2011 |

* cited by examiner

*Primary Examiner* — Kidest Bahta
(74) *Attorney, Agent, or Firm* — Nath, Goldberg & Meyer; Jerald L. Meyer; Tanya E. Harkins

(57) ABSTRACT

A processing apparatus for processing a substrate includes: a plurality of end devices; a low-level controller configured to control specific end devices among the plurality of end devices; and a module controller configured to execute a recipe for processing the substrate, to specify control steps satisfying a specific condition among a plurality of control steps of the recipe, and to transmit the specified control steps to the low-level controller, wherein the low-level controller controls the specific end devices based on the control steps received from the module controller.

9 Claims, 8 Drawing Sheets

FIG. 5

| Item | Type | STEP6 | STEP7 | STEP8 | STEP9 |
|---|---|---|---|---|---|
| Step Number | unit8 | 6 | 7 | 8 | 9 |
| Time[ms] | unit16 | 12 | 14 | 10 | 8 |
| Repeat Step Number | unit8 | | | | 6 |
| Repeat Count[times] | unit16 | | | | 200 |
| VLV1 | bool | 0 | 0 | 1 | 0 |
| ⋮ | | | | | |
| VLV16 | bool | 0 | 1 | 0 | 0 |
| RF-ON1 | bool | 1 | 0 | 0 | 0 |
| RF-ON2 | bool | 0 | 0 | 0 | 1 |

FIG. 8

| | TiCl$_4$ | N$_2$ | NH$_3$ | N$_2$ |
|---|---|---|---|---|
| Time | 0.035 | 0.2 | 0.3 | 0.027 |
| TiCl$_4$ Flow Mode | | | | |
| N$_2$-1 Flow Mode | | | | |
| NH$_3$ Flow Mode | | | | |
| N$_2$-2 Flow Mode | | | | |

⟶ Gas Flow
--⟶ Gas Flow Filling

PROCESSING APPARATUS AND PROCESSING METHOD

CROSS-REFERENCE TO RELATED APPLICATION(S)

This application is based upon and claims the benefit of priority from Japanese Patent Application No. 2019-075709, filed on Apr. 11, 2019, the entire contents of which are incorporated herein by reference.

TECHNICAL FIELD

The present disclosure relates to a processing apparatus and a processing method.

BACKGROUND

In a manufacturing process of a semiconductor device, an atomic layer deposition (ALD) method, in which a thin unit film as a substantially monolayer is repeatedly stacked on a substrate by switching a plurality of processing gases, is used. In addition, a plasma enhanced atomic layer deposition (PEALD) method using plasma during a film formation process is also used.

PRIOR ART DOCUMENT

Patent Document

Patent Document 1: Japanese laid-open publication No. 2002-329674

SUMMARY

A processing apparatus according to an aspect of the present disclosure is a processing apparatus for processing a substrate including: a plurality of end devices; a low-level controller configured to control specific end devices among the plurality of end devices; and a module controller configured to execute a recipe for processing the substrate, to specify control steps satisfying a specific condition among a plurality of control steps of the recipe, and to transmit the specified control steps to the low-level controller, wherein the low-level controller controls the specific end devices based on the control steps received from the module controller.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a view illustrating an example of a high-speed recipe.

FIG. 8 is a view illustrating an example of one cycle of an ALD film-forming sequence according to an embodiment of the present embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a processing apparatus and a processing method disclosed will be described in detail with reference to the drawings. Further, the disclosed technology is not limited by the following embodiments.

Conventionally, in a processing apparatus that performs an ALD method, a controller controls respective components of the processing apparatus so that a predetermined process can be performed in a process container accommodating a substrate. In this case, it is necessary to switch processing gases at a high speed. In order to rapidly switch the processing gases in a processing apparatus, a programmable logic controller (PLC) that controls valves, for example, has been proposed to download a recipe from a controller and operate the valves according to the downloaded recipe. However, such a PLC operates according to the recipe until the process is completed. Thus, flexibility in control becomes poor when control steps of a recipe which does not require a high-speed control are included. Therefore, it is expected to shorten a recipe time of a recipe, in which control steps requiring a high-speed control and control steps that do not require a high-speed control coexist, and to shorten a final processing time of a film-forming process.

[Configuration of Processing Apparatus 100]

Figure 1:
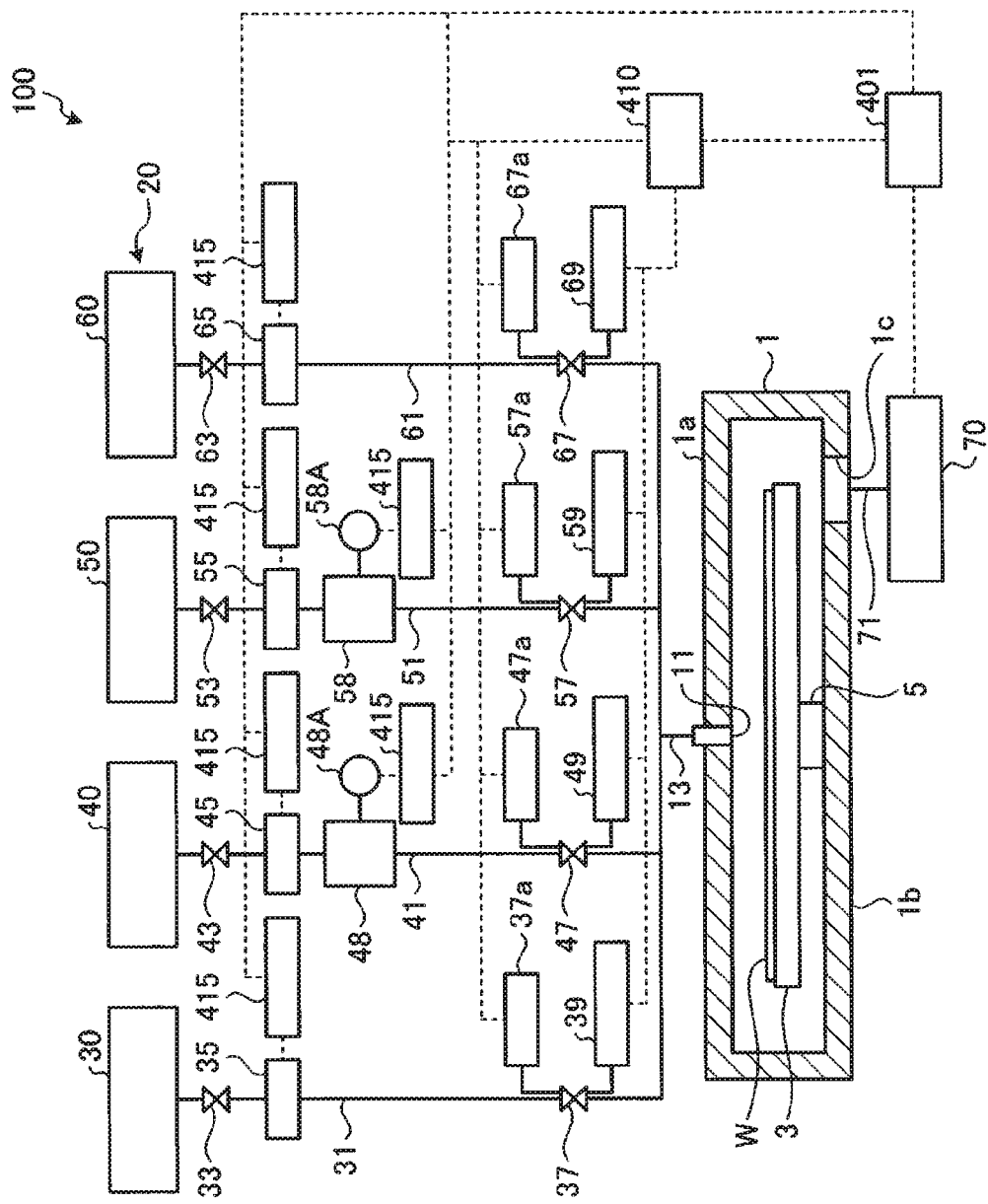
FIG. 1 is a view illustrating an exemplary configuration of a processing apparatus according to an embodiment of the present disclosure.

FIG. 1 is a view illustrating an exemplary configuration of a processing apparatus according to an embodiment of the present disclosure. A processing apparatus 100 illustrated in FIG. 1 is a film-forming apparatus configured to perform a film-forming process by, for example, an ALD method on a semiconductor wafer (hereinafter, referred to as a "wafer") W as a substrate. The processing apparatus 100 has a substantially cylindrical process container 1, which is configured to be airtight. A susceptor 3 configured to horizontally support the wafer W as a target substrate is disposed in the process container 1. The susceptor 3 is supported by a cylindrical support 5. In addition, a heater (not shown) is embedded in the susceptor 3, and by supplying electric power to the heater, the wafer W is heated to a predetermined temperature.

A gas inlet 11 is provided on a ceiling wall 1a of the process container 1. A gas discharge hole (not shown) is formed in the gas inlet 11. In addition, a pipe 13 as a gas supply path is connected to the gas inlet 11. The pipe 13 is a pipe at which pipes 31, 41, 51, and 61 join. Each of the pipes 31, 41, 51, and 61 is connected to a gas source 20, which supplies a film-forming source material gas and the like.

The processing apparatus 100 shown in FIG. 1 illustrates a case where a TiN film is formed on a surface of the wafer W by an ALD method. In this case, the gas source 20 includes a $N_2$ gas source 30 as a purge gas source, a $NH_3$ gas source 40 as a reaction gas source, a $TiCl_4$ gas source 50 as a source gas source, and a $N_2$ gas source 60 as another purge gas source.

The $N_2$ gas source 30 is connected to the gas inlet 11 via the pipes 31 and 13. A valve 33, a mass flow controller (MFC) 35 for controlling a flow rate, and a chamber valve 37 are provided in the pipe 31.

The $NH_3$ gas source 40 is connected to the gas inlet 11 via the pipes 41 and 13. A valve 43, an MFC 45 for controlling a flow rate, and a chamber valve 47 are provided in the pipe 41. In addition, a buffer tank 48 is provided in the pipe 41 at the upstream side of the chamber valve 47 in a gas supply direction, which is closer to the $NH_3$ gas source 40. A manometer 48A for measuring an internal pressure is attached to the buffer tank 48.

The $TiCl_4$ gas source 50 is connected to the gas inlet 11 via the pipes 51 and 13. The $TiCl_4$ gas source 50 includes a vaporizer (not shown). A valve 53, an MFC 55 for controlling a flow rate, and a chamber valve 57 are provided in the pipe 51. In addition, a buffer tank 58 is installed in the pipe 51 at the upstream side of the chamber valve 57 in the gas supply direction, which is closer to the $TiCl_4$ gas source 50. A manometer 58A for measuring an internal pressure is attached to the buffer tank 58.

The $N_2$ gas source 60 is connected to the gas inlet 11 via the pipes 61 and 13. A valve 63, an MFC 65 for controlling a flow rate, and a chamber valve 67 are provided in the pipe 61.

The chamber valves 37, 47, 57, and 67 are valves provided at locations closest to the process container 1 in the pipes 31, 41, 51, and 61, respectively. By opening the chamber valves 37, 47, 57, and 67, the respective gases are introduced into the process container 1. By closing the chamber valves 37, 47, 57, and 67, the introduction of the respective gases into the process container 1 is stopped.

All of the chamber valves 37, 47, 57, and 67 are electromagnetic valves (solenoid valves) which can be opened and closed at a high speed. In FIG. 1, for convenience of description, solenoids 37a, 47a, 57a, and 67a as valve driving parts are illustrated for the chamber valves 37, 47, 57, and 67, respectively. The solenoids 37a, 47a, 57a, and 67a are parts of the chamber valves 37, 47, 57, and 67, respectively.

In addition, chamber valve sensors (CV sensors) 39, 49, 59, and 69 as sensor parts, which are formed by, for example, position sensors or the like, are disposed in the chamber valves 37, 47, 57, and 67, respectively. The CV sensors 39, 49, 59, and 69 monitor opening and closing states of the chamber valves 37, 47, 57, and 67, respectively, which are driven by the solenoids 37a, 47a, 57a, and 67a, respectively.

Although the processing apparatus 100 in FIG. 1 illustrates the sources of the reaction gas, the source gas, and the purge gas, the gas source 20 may also have another gas source such as a cleaning gas source for cleaning the interior of the process container 1, a pipe, a valve, and the like.

An exhaust port 1c is formed in a bottom wall 1b of the process container 1, and an exhaust device 70 is connected to the exhaust port 1c via an exhaust pipe 71. The exhaust device 70 is configured to depressurize, when operated, the interior of the process container 1 to a predetermined degree of vacuum.

[Configuration Example of Control System]

Next, a control system of the processing apparatus 100 will be described with reference to FIGS. 1 to 3. The processing apparatus 100 is controlled by a module controller (MC) 401 such that a predetermined process can be performed in the process container 1, as described later.

Figure 2:
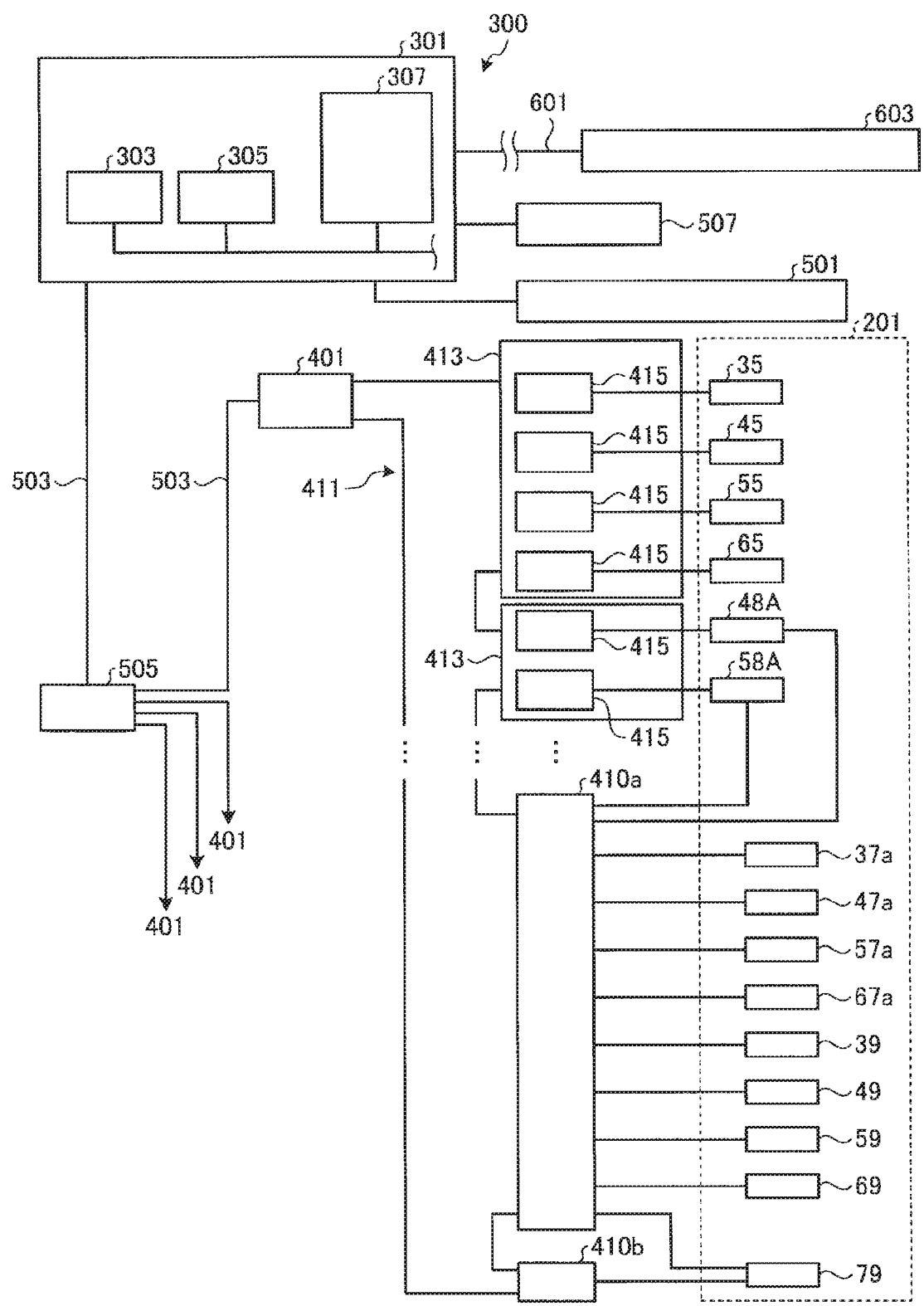
FIG. 2 is a block diagram illustrating an exemplary configuration of a control system of a substrate processing system including a processing apparatus according to an embodiment of the present disclosure.

FIG. 2 is a block diagram illustrating an exemplary configuration of a control system of a substrate processing system including the processing apparatus according to an embodiment of the present disclosure. In the control system of the substrate processing system (not shown) including the processing apparatus 100, a portion related to a control of the processing apparatus 100 that performs an ALD process is schematically illustrated in FIG. 2. A control of the overall substrate processing system, and controls of the respective components constituting the processing apparatus 100 as a process ship, i.e., a control of an end device 201, are performed by a controller 300. Here, the end device 201 may include, for example, the chamber valves 37, 47, 57, and 67 (the solenoids 37a, 47a, 57a, and 67a), the MFCs 35, 45, 55, and 65, the manometers 48A and 58A, the CV sensors 39, 49, 59, and 69, the exhaust device 70, and the like in the processing apparatus 100 illustrated in FIG. 1.

As illustrated in FIG. 2, the controller 300 includes, as main components, a plurality of MCs 401 each of which is an individual controller provided correspondingly to each processing apparatus (including the processing apparatus 100) of the substrate processing system, an equipment controller (EC) 301 which is a general controller for controlling the overall substrate processing system, and a user interface 501 connected to the EC 301. Further, in the substrate processing system, the MCs 401 may be disposed not only in the processing apparatus 100 but also in, for example, a processing apparatus which performs another process, a load lock chamber, and a loader unit. Although these MCs 401 are also generally controlled by the EC 301, illustration and description thereof will be omitted herein.

[EC]

The EC 301 is a general controller that controls the overall operation of the substrate processing system by generally controlling the individual MCs 401. The EC 301 includes a central processing unit (CPU) 303, a random access memory (RAM) 305 as a volatile memory, and a hard disk device 307 as a storage. The EC 301 and each MC 401 are connected by a local area network (LAN) 503 in the system. The LAN 503 in the system has a switching hub (HUB) 505. The switching hub 505 switches the MCs 401 as a connection destination of the EC 301 according to a control signal from the EC 301.

In addition, the EC 301 is connected, via a LAN 601, to a host computer 603 as a manufacturing execution system (MES), which manages manufacturing processes in the entire factory in which the substrate processing system is installed. In cooperation with the controller 300, the host computer 603 feeds real-time information on various processes in the factory back to a core business system (not shown), and makes a determination on the processes in consideration of a load or the like of the entire factory.

In addition, the user interface 501 is also connected to the EC 301. The user interface 501 includes a keyboard for allowing a process manager to input commands to manage the substrate processing system, a display for visually displaying the operation status of the substrate processing system, a mechanical switch, and the like.

The EC 301 is configured to record information on a computer-readable storage medium (hereinafter, simply referred to as a "storage medium") 507 and to read information from the storage medium 507. A control program or a recipe may be used, for example, by installing the control program or the recipe stored in the storage medium 507 in the hard disk device 307 as a storage. As the storage medium 507, for example, a compact disc read only memory (CD-ROM), a hard disk, a flexible disk, a flash memory, a digital versatile disc (DVD), or the like may be used. Furthermore, the recipe may be used online by transmitting the recipe from another device through, for example, a dedicated line as needed.

In the EC 301, the CPU 303 reads a program (software), which includes a recipe related to a processing method of the wafer W specified by a user or the like through the user interface 501, from the hard disk device 307 or the storage medium 507. Then, the program is transmitted from the EC 301 to each MC 401 such that processes in the processing apparatuses including the processing apparatus 100 can be controlled by each MC 401. Hereinafter, a relationship between the processing apparatus 100 and the MC 401 which controls the same will be described.

[MC]

Figure 3:
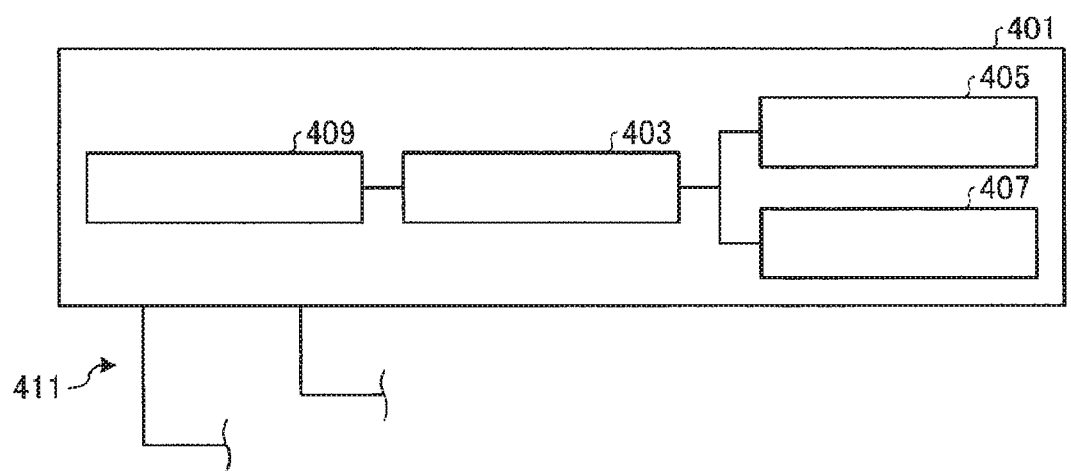
FIG. 3 is a block diagram illustrating an exemplary configuration of a module controller.

FIG. 3 is a block diagram illustrating an exemplary configuration of the module controller. The MC 401 is provided as an individual controller which controls the operation of the processing apparatus 100. As illustrated in FIG. 3, the MC 401 includes a CPU 403, a volatile memory 405 such as a RAM, a nonvolatile memory 407, and a media access controller (MAC) 409.

The nonvolatile memory 407 of the MC 401 is configured by, for example, a nonvolatile memory such as a static random access memory (SRAM), a magnetoresistive random access memory (MRAM), an electrically erasable programmable read only memory (EEPROM), a flash memory, or the like. The nonvolatile memory 407 stores various pieces of history information in the processing apparatus 100, for example, a replacement time of the heater in the susceptor 3, an operation time of the exhaust device 70, and the like. In addition, the nonvolatile memory 407 also functions as an I/O information storage, and is configured to write and store various types of I/O information (particularly, digital output information DO and analog output information AO) exchanged between the MC 401 and each end device 201 in the nonvolatile memory 407 as needed, as described later.

[Fieldbus System]

The MC 401 uses EtherCAT (registered trademark) as a network 411, which is a fieldbus system that performs communications with each end device 201. The EtherCAT is an industrial Ethernet (registered trademark) technology, and performs communications using one frame for every transmission/reception process data of all nodes in a network segment. The MC 401 becomes an EtherCAT master device by using the MAC 409. In addition, a network interface card (NIC) or the like for Ethernet may be used as the MAC 409.

Each end device 201 is controlled by a low-level controller 410 or an input/output (I/O) module 413. Each of the low-level controller 410 and the I/O module 413 has an EtherCAT slave controller (ESC) and becomes an EtherCAT slave device.

In the network 411, the MC 401 is connected to the low-level controller 410 and the I/O module 413, which are respective nodes, by a network topology without being disconnected. That is, the network 411 is configured such that a frame transmitted by the MC 401 returns to the MC 401 via the individual nodes. In the network 411, when the MC 401 transmits a frame, the frame sequentially passes through the low-level controller 410 and the I/O module 413. Each of the low-level controller 410 and the I/O module 413 reads out data in the frame, which is addressed to itself, on the fly, or writes data in the frame and then transmits the frame to a subsequent node.

A relationship between the low-level controller 410 and the I/O module 413, and EtherCAT will be described below. The EtherCAT is standardized to be capable of performing control in units of 1 ms, and can monitor various signals compared with the related art. However, it is difficult to guarantee control in units of 1 ms when executing a recipe by the EtherCAT, due to a limit of the communication speed of the master device (MAC 409). That is, it is difficult to shorten the recipe time. For this reason, in the processing apparatus 100 of the present disclosure, the low-level controller 410 which controls the end devices 201 that require a high-speed control in units of 1 ms, and the I/O module 413 which controls the end devices 201 that do not require a high-speed control in units of 1 ms are provided.

The low-level controller 410 is a controller which includes, for example, a CPU, a RAM, a read only memory (ROM), a field programmable gate array (FPGA), an EtherCAT slave controller (ESC), an I/O port, and the like, and which controls the end devices 201 that perform a high-speed control. The low-level controller 410 performs input and output of digital signals, analog signals, and serial signals using the I/O port. In addition, the low-level controller 410 performs communications with the MC 401, the other low-level controllers 410, and the I/O module 413 using the ESC. The low-level controller 410 controls a corresponding end device 201 based on a specific control step (high-speed control step) received from the MC 401 in the recipe.

The end devices 201 requiring a high-speed control and monitoring, for example, the solenoids 37a, 47a, 57a, and 67a and the CV sensors 39, 49, 59 and 69 of the chamber valves 37, 47, 57, and 67, respectively, the manometers 48A and 58A, and the like are connected to the low-level controller 410. In addition, in the case of the processing apparatus 100 which performs a PEALD method, a matching device or a high-frequency power supply 79 is connected to the low-level controller 410. In this case, a low-level controller 410a that performs a high-speed control and a low-level controller 410b that performs monitoring or logging of the high-frequency power supply 79 may be separately configured.

The low-level controller 410 receives, from the MC 401 via the network 411, control steps satisfying a specific condition, for example, control steps in a range in which repetitive processing is performed, among a plurality of control steps of the recipe. The low-level controller 410 controls the corresponding end device 201 based on the received specific control steps. The low-level controller 410 performs input and output of the digital signals, the analog signals, and the serial signals to and from the corresponding end device 201.

Input/output information managed by the low-level controller 410 includes four types of information: digital input information DI, digital output information DO, analog input information AI, and analog output information AO. The digital input information DI is related to digital information input from each end device 201 located at a low level in the control system to the MC 401 located at a high level in the control system. The digital output information DO is related to digital information output from the MC 401 located at a high level in the control system to each end device 201 located at a low level in the control system. The analog input information AI is related to analog information input from each end device 201 to the MC 401. The analog output information AO is related to analog information output from the MC 401 to each end device 201.

The digital input information DI and the analog input information AI include, for example, information on the status of each end device 201. The digital output information DO and the analog output information AO include, for example, set values or commands related to a process condition or the like for each end device 201. In addition, the digital information in the low-level controller 410 may include information relating to opening and closing of each of the chamber valves 37, 47, 57, and 67 (solenoids 37a, 47a, 57a, and 67a). In addition, the analog information in the low-level controller 410 may include information such as an internal pressure or like of the buffer tanks 48 and 58. For example, the low-level controller 410 outputs the digital output information DO for controlling the opening and closing of the solenoids 37a, 47a, 57a, and 67a. In addition, for example, the analog input information AI is input from the manometers 48A and 58A to the low-level controller 410, and the digital input information DI is input from the CV sensors 39, 49, 59, and 69 to the low-level controller 410. The low-level controller 410 uses the digital output information DO, the analog input information AI, and the digital input information DI for control and stores them as monitoring data. The low-level controller 410 may also transmit the monitoring data to the MC 401 or the EC 301 at a high level.

The I/O module 413 has a plurality of I/O boards 415 connected to the end devices 201 constituting the processing apparatus 100, respectively. The I/O boards 415 are low-level control units which operate under the control of the MC 401 via the ESC of the I/O module 413. The control of the input and output of the digital signals, analog signals, and serial signals in the I/O module 413 is performed by the I/O boards 415. For the sake of convenience, FIGS. 1 and 2 representatively illustrate connections between the low-level controller 410 and the I/O module 413, and some of the end devices 201.

Input/output information managed by the I/O boards 415 includes four types of information: digital input information DI, digital output information DO, analog input information AI, and analog output information AO, like the low-level controller 410. The digital information in the I/O boards 415 may include information such as ON and OFF of the exhaust device 70, opening and closing of valves (not shown) in the exhaust system, or the like. The analog information in the I/O boards 415 may include information such as a set temperature of the heater (not shown) in the susceptor 3, flow rates in the MFCs 35, 45, 55, and 65, or the like. Illustration and description of detailed contents of each input/output information will be omitted.

[ALD Process]

In the processing apparatus 100, with the wafer W mounted on the susceptor 3, the processing gas is supplied from the gas inlet 11 toward the wafer W while heating the wafer W by the heater (not shown), so as to form a predetermined thin film on the surface of the wafer W by the ALD method. For example, in the formation of a TiN film by the ALD method, a thin film can be deposited by repeatedly performing a plurality of cycles with a series of steps 1) to 7) set forth below as one cycle.

ALD Process of One Cycle:

1) The chamber valve 57 is opened to supply a $TiCl_4$ gas as a source gas from the $TiCl_4$ gas source 50 into the process container 1. Thus, $TiCl_4$ is adhered to the surface of the wafer W.

2) The chamber valve 57 is closed to stop the supply of the $TiCl_4$ gas.

3) The chamber valve 67 is opened to introduce a $N_2$ gas from the $N_2$ gas source 60 into the process container 1. Thus, the interior of the process container 1 is purged and the remaining $TiCl_4$ gas is removed.

4) The chamber valve 67 is closed to stop the supply of the $N_2$ gas.

5) The chamber valve 47 is opened to supply an $NH_3$ gas as a reaction gas from the $NH_3$ gas source 40 into the processing container 1, such that the $NH_3$ gas reacts with $TiCl_4$ adhered to the surface of the wafer W. Thus, a thin TiN film of a single layer is formed.

6) The chamber valve 47 is closed to stop the supply of the $NH_3$ gas.

7) The chamber valve 37 is opened to introduce a $N_2$ gas from the $N_2$ gas source 30 into the process container 1. Thus, the interior of the process container 1 is purged and the remaining $NH_3$ gas is removed.

In the series of steps 1) to 7) set forth above, while the chamber valve 57 is closed, the buffer tank 58 is filled with the $TiCl_4$ gas so as to increase the internal pressure of the buffer tank 58. Using this pressure increase, when the chamber valve 57 is opened at step 1), the $TiCl_4$ gas is rapidly injected from the gas inlet 11 into the process container 1. Similarly, while the chamber valve 47 is closed, the buffer tank 48 is filled with the $NH_3$ gas so as to increase the internal pressure of the buffer tank 48. Using this pressure increase, when the chamber valve 47 is opened at step 5), the $NH_4$ gas is rapidly injected from the gas inlet 11 into the process container 1. Therefore, the buffer tanks 48 and 58 are repeatedly subject to large variations between highs and lows in the internal pressure due to the opening and closing of the chamber valves 47 and 57. Since the pressure variations in the buffer tanks 48 and 58 are very large, compared with those in the pipes 41 and 51, for example, an abnormality in the process is easily detected by using the pressure variations in the buffer tanks 48 and 58 as an index.

In the ALD process, since the aforementioned cycle is repeated, it is necessary to supply and stop gases intermittently, repeatedly and accurately in a short time in order to perform a good film-forming process. Therefore, in the ALD process, it is necessary to monitor values of the CV sensors 39, 49, 59, and 69, and the manometers 48A and 58A for detecting the internal pressures of the buffer tanks 48 and 58, while controlling the solenoids 37a, 47a, 57a, and 67a at a high speed. In the present embodiment, the low-level controller 410 performs control and monitoring of specific control steps of the recipe, which are received from the MC 401 in advance, in units of 1 ms. Thus, the recipe time can be shortened. [Example of High-Speed Recipe Control]

Figure 4:
FIG. 4 is a view illustrating an example of a recipe including high-speed recipes.

FIG. 4 is a view illustrating an example of a recipe including high-speed recipes. A recipe 700 illustrated in FIG. 4 is an example of a recipe executed by the MC 401, and includes high-speed recipes 701 and 702 requiring a high-speed control. In the example of the recipe 700, control steps in which "High Speed Error Flag" column set to "On" are defined as high-speed recipes which can be controlled in units of 1 ms. In addition, in the example of the recipe 700, a unit of a high-speed recipe is defined as one repetition, and repetition of executing each control step once is defined as one cycle.

The MC 401 transmits the high-speed recipes 701 and 702 to the low-level controller 410 before executing the recipe. The recipes are transmitted (downloaded) to the low-level controller 410 in advance to minimize influence on the recipe execution time. The low-level controller 410 stores the received high-speed recipes 701 and 702. The MC 401 executes the recipe 700 sequentially from a control step "STEP 1." After execution of the control step "STEP 2," the MC 401 transmits a trigger signal 703 for instructing the low-level controller 410 to execute the high-speed recipe 701.

Upon receipt of the trigger signal 703 from the MC 401, the low-level controller 410 repeatedly executes control steps "STEP 3" to "STEP 20" of the high-speed recipe 701 for a specified number of cycles, for example, 315 cycles. When the high-speed recipe 701 is completed, the low-level controller 410 transmits high-speed recipe complete information to the MC 401.

Upon receipt of the high-speed recipe completion information from the low-level controller 410, the MC 401 executes control steps "STEP 21" to "STEP 30" of the recipe 700. After execution of the control step "STEP 30," the MC 401 transmits a trigger signal 704 for instructing the low-level controller 410 to execute the high-speed recipe 702.

Upon receipt of the trigger signal 704 from the MC 401, the low-level controller 410 repeatedly executes control steps "STEP 31" to "STEP 45" of the high-speed recipe 702 for a specified number of cycles, for example, 20 cycles. When the high-speed recipe 702 is completed, the low-level controller 410 transmits high-speed recipe completion information to the MC 401. The low-level controller 410 may set a completion flag when each of the high-speed recipes 701 and 702 is completed, and the MC 401 may monitor the completion flag.

Upon receipt of the high-speed recipe completion information from the low-level controller 410, the MC 401 executes a control step "STEP 46" and subsequent steps of the recipe 700. As described above, in the processing apparatus 100 of the present embodiment, among the control steps of the recipe, control steps requiring a high-speed control are specified and stored in the low-level controller 410 in advance. Thus, the recipe time can be shortened through adjustment in units of 1 ms.

Next, details of the high-speed recipes will be described with reference to FIGS. 5 and 6. FIG. 5 is a view illustrating an example of a high-speed recipe. A high-speed recipe 705 illustrated in FIG. 5 is an example of a high-speed recipe in which control steps "STEP 6" to "STEP 9" are repeated. In the high-speed recipe 705, a column 706 indicates the number of a control step corresponding to a start, and a column 707 indicates the number of a control step corresponding to an end. In addition, a column 708 indicates that a return destination after execution of the control step "STEP 9" is the control step "STEP 6." In the high-speed recipe 705, execution times of the control steps "STEP 6" to "STEP 9" are 12 ms, 14 ms, 10 ms, and 8 ms, respectively. That is, the high-speed recipe 705 is a recipe that performs control in units of 1 ms.

Figure 6:
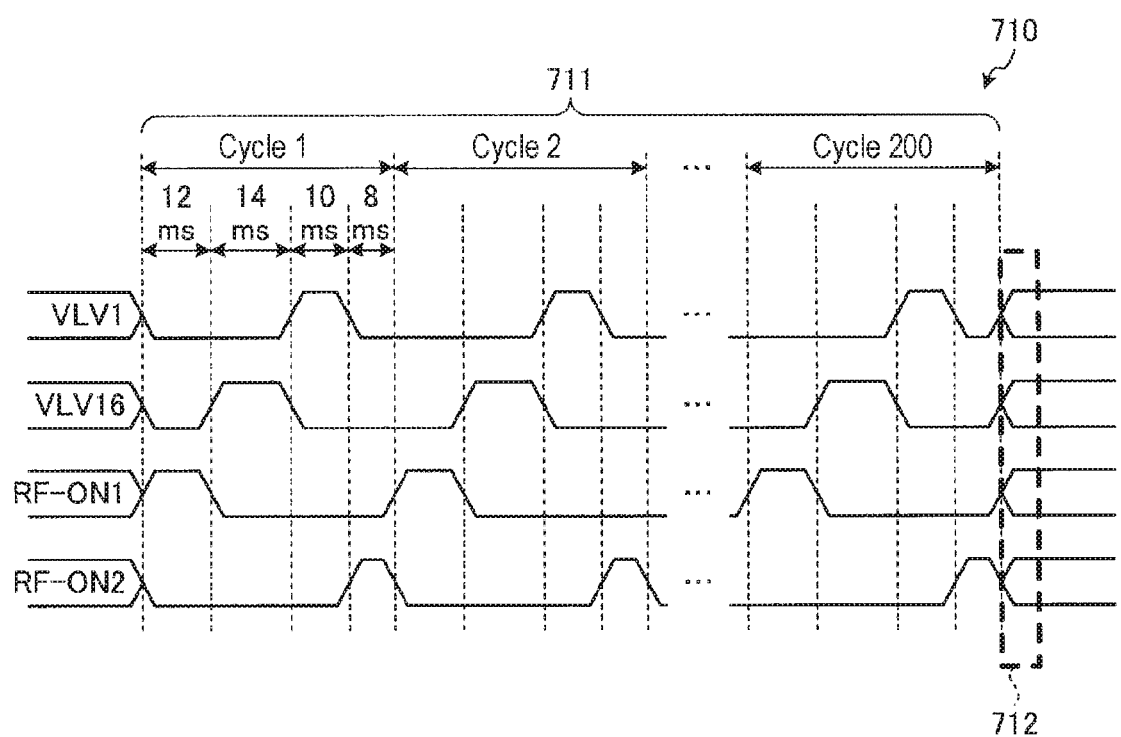
FIG. 6 is a timing chart illustrating an example of an operation of a high-speed recipe.

FIG. 6 is a timing chart illustrating an example of an operation of a high-speed recipe. A timing chart 710 illustrated in FIG. 6 indicates operation results of "VLV1," "VLV16," "RF-ON1," and "RF-ON2" when the high-speed recipe 705 illustrated in FIG. 5 is executed. In addition, "VLV1" and "VLV16" indicate valves, for which "1" corresponds to open in FIG. 5 and "H" corresponds to open in FIG. 6. In addition, "RF-ON1" and "RF-ON2" indicate high-frequency power supplies, for which "1" corresponds to application in FIG. 5 and "H" corresponds to application in FIG. 6. Upon receipt of a trigger signal from the MC 401, the low-level controller 410 executes the high-speed recipe 705 for 200 cycles during a time period 711. At this time, even when the low-level controller 410 receives any other instruction from the MC 401, the low-level controller 410 does not accept the instruction and transmits digital output information DO. Further, when the execution of the high-speed recipe 705 has been completed, the low-level controller 410 holds DO 712, which is the digital output information at the time of completion. Upon receipt of an interruption command (stop command) from the upper MC 401, the low-level controller 410 accepts the command and stops. In addition, when the low-level controller 410 cannot confirm a recipe execution instruction with the upper MC 401, the low-level controller 410 detects occurrence of a timeout and stops after a lapse of a predetermined time.

Figure 7:
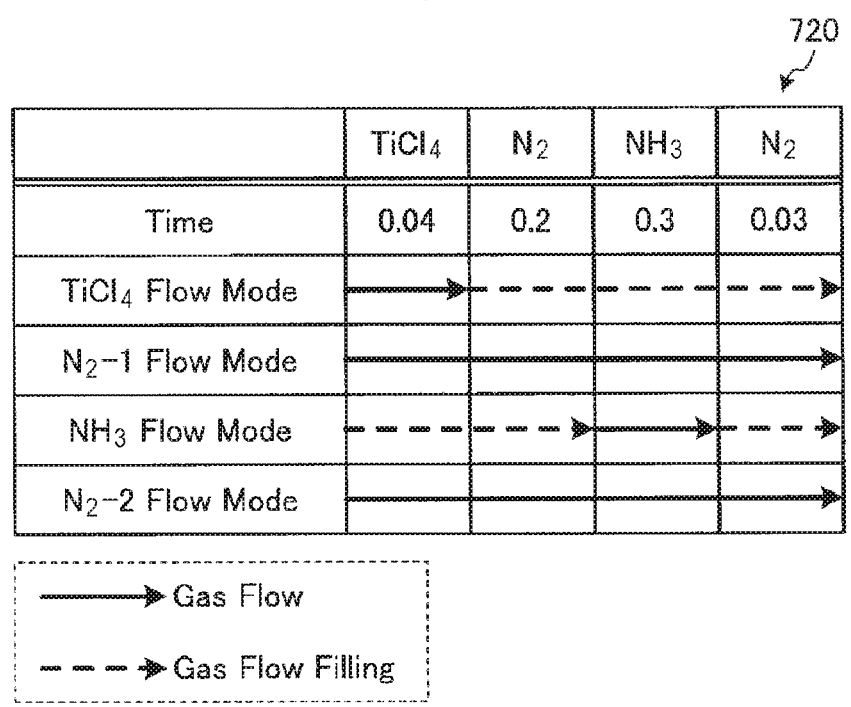
FIG. 7 is a view illustrating an example of one cycle of an ALD film-forming sequence according to a comparative example.

Next, a comparison between the present embodiment and a comparative example will be made with reference to FIGS. 7 and 8. FIG. 7 is a view illustrating an example of one cycle of an ALD film-forming sequence according to the comparative example. Table 720 illustrated in FIG. 7 indicates a case where control steps proceed in the order of $TiCl_4$, $N_2$, $NH_3$, and $N_2$ according to the comparative example, in which control of the processing gases is performed in units of 10 ms. In the control step of $TiCl_4$, a $TiCl_4$ gas filled in a buffer tank and a $N_2$ gas are supplied to a process container for 0.04 seconds. Subsequently, in the control step of $N_2$, a $N_2$ gas is supplied to the process container for 0.2 seconds. Next, a $NH_3$ gas filled in a buffer tank and a $N_2$ gas are supplied to the process container for 0.3 seconds. Subsequently, in the control step of $N_2$, a $N_2$ gas is supplied to the process container for 0.03 seconds. In the comparative example, this cycle is repeated 500 times, and the processing time becomes 285 seconds.

FIG. 8 is a view illustrating an example of one cycle of an ALD film-forming sequence according to the present embodiment. Table 721 illustrated in FIG. 8 indicates a case where control steps proceed in the order of $TiCl_4$, $N_2$, $NH_3$, and $N_2$ according to the present embodiment, in which control of the processing gases is performed in units of 1 ms. In the control step of $TiCl_4$, a $TiCl_4$ gas filled in a buffer tank and a $N_2$ gas are supplied to a process container for 0.035 seconds. Subsequently, in the control step of $N_2$, a $N_2$ gas is supplied to the process container for 0.2 seconds. Next, a $NH_3$ gas filled in a buffer tank and a $N_2$ gas are supplied to the process container for 0.3 seconds. Subsequently, in the control step of $N_2$, a $N_2$ gas is supplied to the process container for 0.027 seconds. In the present embodiment, as indicated in the "Time" column 722 of the $TiCl_4$ gas and the "Time" column 723 of the $N_2$ gas, the processing times are shortened by 5 ms and 3 ms, respectively. In the present embodiment, this cycle is repeated 500 times, and the processing time becomes 281 seconds, thereby shortening the processing time by 4 seconds compared to the comparative example.

As described above, according to the present embodiment, the processing apparatus 100 processes the substrate, and includes the plurality of end devices 201, the low-level controller 410 which controls specific end devices 201, and the controller (MC) 401. The controller (MC) 401 executes a recipe for processing the substrate, specifies control steps satisfying a specific condition among a plurality of control steps of the recipe, and transmits the specified control steps to the low-level controller 410. The low-level controller 410 controls corresponding specific end devices 201 based on the control steps received from the controller (MC) 401. As a result, the recipe time can be shortened.

According to the present embodiment, after completion of the specified control steps, the controller (MC) 401 controls end devices 201 which are not controlled by the low-level controller 410 based on other control steps. As a result, the controller 401 can execute control steps that do not require a high-speed control.

According to the present embodiment, the specific end devices 201 are the chamber valves 37, 47, 57, and 67, which are disposed in the gas supply paths provided in a plurality of systems corresponding to the types of the processing gases supplied into the process container 1 accommodating the substrate, and which perform opening and closing of the gas supply paths. As a result, the processing gases can be controlled a high speed and precisely.

According to the present embodiment, the specified control steps are control steps of a range in which repetitive processing is performed. As a result, a processing time of the repetitive processing can be shortened.

According to the present embodiment, the specified control steps are control steps requiring a high-speed control compared with other control steps. As a result, a processing time of the control steps requiring a high-speed control can be shortened.

According to the present embodiment, the specified control steps are control steps which are controlled in units of 1 ms. As a result, the processing time can be shortened in units of 1 ms.

According to the present embodiment, the low-level controller 410 monitors the corresponding specific end devices 201 and stores monitoring data. As a result, the monitoring data can be verified when a trouble occurs.

According to the present embodiment, the specific end devices 201 include the high-frequency power supply 79 for generating plasma in the process container 1 accommodating the substrate. As a result, plasma ignition can be controlled at a high speed and precisely.

Further, in the aforementioned embodiment, the processing apparatus 100 using the thermal ALD method has been described as an example, but the disclosed technology is not limited thereto. The processing apparatus 100 may be an apparatus that performs processing on the wafer W using a PEALD method including the high-frequency power supply 79. In this case, the plasma source may be, for example, any plasma source such as capacitively-coupled plasma, inductively-coupled plasma, microwave plasma, magnetron plasma, or the like.

According to the present disclosure, it is possible to shorten a recipe time.

While certain embodiments have been described, these embodiments have been presented byway of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing apparatus for processing a substrate, comprising:
 a plurality of end devices including valves, which are disposed in gas supply paths provided in a plurality of systems corresponding to processing gases supplied into a process container accommodating the substrate and which perform opening and closing of the gas supply paths;
 a low-level controller configured to control specific end devices including the valves among the plurality of end devices; and
 a module controller configured to execute a recipe for processing the substrate, to specify control steps requiring a control speed which is higher than a control speed of other control steps among a plurality of control steps of the recipe, and to transmit the specified control steps to the low-level controller,
 wherein the low-level controller stores the specified control steps received from the module controller and controls the specific end devices based on the specified control steps received from the module controller,
 after completing the specified control steps, the module controller controls the end devices that are not controlled by the low-level controller based on the other control steps, and
 after execution of the other control steps, the module controller transmits a trigger signal to the low-level controller, and upon receiving the trigger signal from the module controller, the low-level controller repeatedly executes the specified control steps stored in the low-level controller in advance.

2. The apparatus of claim 1, wherein the specified control steps are control steps of a range in which repetitive processing is performed.

3. The apparatus of claim 2, wherein the specified control steps are control steps which are controlled in units of 1 ms.

4. The apparatus of claim 3, wherein the low-level controller monitors the specific end devices, and stores monitoring data.

5. The apparatus of claim 4, wherein the specific end devices include a high-frequency power supply configured to generate plasma in the process container accommodating the substrate.

6. The apparatus of claim 1, wherein the specified control steps are control steps which are controlled in units of 1 ms.

7. The apparatus of claim 1, wherein the low-level controller monitors the specific end devices, and stores monitoring data.

8. The apparatus of claim 1, wherein the specific end devices include a high-frequency power supply configured to generate plasma in the process container accommodating the substrate.

9. A processing method performed by a controller of a processing apparatus for processing a substrate, the processing apparatus comprising a plurality of end devices including valves, which are disposed in gas supply paths provided in a plurality of systems corresponding to processing gases supplied into a process container accommodating the substrate and which perform opening and closing of the gas supply paths, the method comprising:
 specifying control steps requiring a control speed which is higher than a control speed of other control steps among a plurality of control steps of a recipe for processing the substrate;
 transmitting the specified control steps to a low-level controller configured to control specific end devices including the valves among the plurality of end devices;
 causing the low-level controller to store the specified control steps received from a module controller and control the specific end devices for the specified control steps, when executing the recipe for processing the substrate;

causing the module controller to control the end devices that are not controlled by the low-level controller based on the other control steps after completing the specified control steps;

transmitting a trigger signal to the low-level controller after execution of the other control steps; and causing the low-level controller to repeatedly execute the specified control steps stored in the low-level controller in advance upon receiving the trigger signal from the module controller.

\* \* \* \* \*